United States Patent
Shiroki et al.

(10) Patent No.: US 8,546,927 B2
(45) Date of Patent: Oct. 1, 2013

(54) RFIC CHIP MOUNTING STRUCTURE

(75) Inventors: Koji Shiroki, Nagaokakyo (JP); Makoto Osamura, Nagaokakyo (JP); Takeshi Kurihara, Nagaokakyo (JP); Masami Mizuyama, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 154 days.

(21) Appl. No.: 13/223,429

(22) Filed: Sep. 1, 2011

(65) Prior Publication Data
US 2012/0056337 A1    Mar. 8, 2012

(30) Foreign Application Priority Data

Sep. 3, 2010  (JP) ................................ 2010-197807

(51) Int. Cl.
*H01L 23/02*    (2006.01)
*H01L 23/34*    (2006.01)

(52) U.S. Cl.
USPC ........... 257/679; 257/728; 257/778; 257/773; 257/786; 257/E23.069

(58) Field of Classification Search
USPC ........... 257/728, 778, 679, 773, 786, E23.069
See application file for complete search history.

(56) References Cited

U.S. PATENT DOCUMENTS

| | | | |
|---|---|---|---|
| 3,364,564 A | 1/1968 | Kurtz et al. | |
| 4,794,397 A | 12/1988 | Ohe et al. | |
| 5,232,765 A | 8/1993 | Yano et al. | |
| 5,253,969 A | 10/1993 | Richert | |
| 5,337,063 A | 8/1994 | Takahira | |
| 5,374,937 A | 12/1994 | Tsunekawa et al. | |
| 5,399,060 A | 3/1995 | Richert | |
| 5,491,483 A | 2/1996 | D'Hont | |
| 5,528,222 A | 6/1996 | Moskowitz et al. | |
| 5,757,074 A | 5/1998 | Matloubian et al. | |
| 5,854,480 A | 12/1998 | Noto | |
| 5,903,239 A | 5/1999 | Takahashi et al. | |
| 5,936,150 A | 8/1999 | Kobrin et al. | |
| 5,955,723 A | 9/1999 | Reiner | |

(Continued)

FOREIGN PATENT DOCUMENTS

| CA | 2 279 176 A1 | 7/1998 |
|---|---|---|
| DE | 10 2006 057 369 A1 | 6/2008 |

(Continued)

OTHER PUBLICATIONS

Official communication issued in Japanese Application No. 2007-531524, mailed on Sep. 11, 2007.

(Continued)

*Primary Examiner* — Nitin Parekh
(74) *Attorney, Agent, or Firm* — Keating & Bennett, LLP (57) ABSTRACT

An RFIC module includes an RFIC chip that is mounted on a mounting substrate and that is encapsulated with an encapsulation resin layer. The mounting substrate includes a flexible base and electrodes provided on the flexible base. External terminals are disposed near four corners of a mounting surface of the RFIC chip. One of a plurality of mounting lands located on the surface of the flexible base is a shared mounting land and defines an integrated mounting land that is shared by an RF terminal and an NC terminal of the RFIC chip. The shared mounting land is arranged to cover one side of the RFIC chip when viewed from above.

4 Claims, 6 Drawing Sheets

(56) References Cited

U.S. PATENT DOCUMENTS

| | | | |
|---|---|---|---|
| 5,995,006 A | 11/1999 | Walsh | |
| 6,104,611 A | 8/2000 | Glover et al. | |
| 6,107,920 A | 8/2000 | Eberhardt et al. | |
| 6,172,608 B1 | 1/2001 | Cole | |
| 6,181,287 B1 | 1/2001 | Beigel | |
| 6,190,942 B1 | 2/2001 | Wilm et al. | |
| 6,249,258 B1 | 6/2001 | Bloch et al. | |
| 6,259,369 B1 | 7/2001 | Monico | |
| 6,271,803 B1 | 8/2001 | Watanabe et al. | |
| 6,335,686 B1 | 1/2002 | Goff et al. | |
| 6,362,784 B1 | 3/2002 | Kane et al. | |
| 6,367,143 B1 | 4/2002 | Sugimura | |
| 6,378,774 B1 | 4/2002 | Emori et al. | |
| 6,406,990 B1 | 6/2002 | Kawai | |
| 6,448,874 B1 | 9/2002 | Shiino et al. | |
| 6,462,716 B1 | 10/2002 | Kushihi | |
| 6,504,096 B2* | 1/2003 | Okubora | 174/521 |
| 6,542,050 B1 | 4/2003 | Arai et al. | |
| 6,600,459 B2 | 7/2003 | Yokoshima et al. | |
| 6,634,564 B2 | 10/2003 | Kuramochi | |
| 6,664,645 B2 | 12/2003 | Kawai | |
| 6,763,254 B2 | 7/2004 | Nishikawa | |
| 6,812,707 B2 | 11/2004 | Yonezawa et al. | |
| 6,828,881 B2 | 12/2004 | Mizutani et al. | |
| 6,837,438 B1 | 1/2005 | Takasugi et al. | |
| 6,853,087 B2* | 2/2005 | Neuhaus et al. | 257/778 |
| 6,861,731 B2 | 3/2005 | Buijsman et al. | |
| 6,927,738 B2 | 8/2005 | Senba et al. | |
| 6,963,729 B2 | 11/2005 | Uozumi | |
| 6,982,879 B1* | 1/2006 | Franca-Neto et al. | 361/803 |
| 7,088,249 B2 | 8/2006 | Senba et al. | |
| 7,088,307 B2 | 8/2006 | Imaizumi | |
| 7,112,952 B2 | 9/2006 | Arai et al. | |
| 7,119,693 B1 | 10/2006 | Devilbiss | |
| 7,129,834 B2 | 10/2006 | Naruse et al. | |
| 7,157,794 B2* | 1/2007 | Mori | 257/728 |
| 7,248,221 B2 | 7/2007 | Kai et al. | |
| 7,250,910 B2 | 7/2007 | Yoshikawa et al. | |
| 7,276,929 B2 | 10/2007 | Arai et al. | |
| 7,317,396 B2 | 1/2008 | Ujino | |
| 7,405,664 B2 | 7/2008 | Sakama et al. | |
| 7,545,036 B2* | 6/2009 | Terui et al. | 257/728 |
| 7,564,126 B2* | 7/2009 | Jaurimo et al. | 257/686 |
| 2002/0011967 A1 | 1/2002 | Goff et al. | |
| 2002/0015002 A1 | 2/2002 | Yasukawa et al. | |
| 2002/0044092 A1 | 4/2002 | Kushihi | |
| 2002/0053735 A1* | 5/2002 | Neuhaus et al. | 257/728 |
| 2002/0067316 A1 | 6/2002 | Yokoshima et al. | |
| 2002/0093457 A1 | 7/2002 | Hamada et al. | |
| 2002/0180062 A1* | 12/2002 | Hsieh et al. | 257/778 |
| 2003/0006901 A1 | 1/2003 | Kim et al. | |
| 2003/0020661 A1 | 1/2003 | Sato | |
| 2003/0045324 A1 | 3/2003 | Nagumo et al. | |
| 2003/0169153 A1 | 9/2003 | Muller | |
| 2003/0205808 A1* | 11/2003 | Terui et al. | 257/738 |
| 2004/0001027 A1 | 1/2004 | Killen et al. | |
| 2004/0026519 A1 | 2/2004 | Usami et al. | |
| 2004/0056823 A1 | 3/2004 | Zuk et al. | |
| 2004/0066617 A1 | 4/2004 | Hirabayashi et al. | |
| 2004/0217915 A1 | 11/2004 | Imaizumi | |
| 2004/0219956 A1 | 11/2004 | Iwai et al. | |
| 2004/0227673 A1 | 11/2004 | Iwai et al. | |
| 2004/0252064 A1 | 12/2004 | Yuanzhu | |
| 2005/0092836 A1 | 5/2005 | Kudo | |
| 2005/0099337 A1 | 5/2005 | Takei et al. | |
| 2005/0125093 A1 | 6/2005 | Kikuchi et al. | |
| 2005/0134460 A1 | 6/2005 | Usami | |
| 2005/0134506 A1 | 6/2005 | Egbert | |
| 2005/0138798 A1 | 6/2005 | Sakama et al. | |
| 2005/0140512 A1 | 6/2005 | Sakama et al. | |
| 2005/0232412 A1 | 10/2005 | Ichihara et al. | |
| 2005/0236623 A1 | 10/2005 | Takechi et al. | |
| 2005/0275539 A1 | 12/2005 | Sakama et al. | |
| 2006/0001138 A1 | 1/2006 | Sakama et al. | |
| 2006/0032926 A1 | 2/2006 | Baba et al. | |
| 2006/0044192 A1 | 3/2006 | Egbert | |
| 2006/0055601 A1 | 3/2006 | Kameda et al. | |
| 2006/0071084 A1 | 4/2006 | Detig et al. | |
| 2006/0109185 A1 | 5/2006 | Iwai et al. | |
| 2006/0145872 A1 | 7/2006 | Tanaka et al. | |
| 2006/0158380 A1 | 7/2006 | Son et al. | |
| 2006/0170606 A1 | 8/2006 | Yamagajo et al. | |
| 2006/0214801 A1 | 9/2006 | Murofushi et al. | |
| 2006/0220871 A1 | 10/2006 | Baba et al. | |
| 2006/0244676 A1 | 11/2006 | Uesaka | |
| 2006/0267138 A1 | 11/2006 | Kobayashi | |
| 2007/0004028 A1 | 1/2007 | Lair et al. | |
| 2007/0018893 A1 | 1/2007 | Kai et al. | |
| 2007/0040028 A1 | 2/2007 | Kawamata | |
| 2007/0052613 A1 | 3/2007 | Gallschuetz et al. | |
| 2007/0057854 A1 | 3/2007 | Oodachi et al. | |
| 2007/0069037 A1 | 3/2007 | Kawai | |
| 2007/0132591 A1 | 6/2007 | Khatri | |
| 2007/0164414 A1 | 7/2007 | Dokai et al. | |
| 2007/0200782 A1 | 8/2007 | Hayama et al. | |
| 2007/0229276 A1 | 10/2007 | Yamagajo et al. | |
| 2007/0252700 A1 | 11/2007 | Ishihara et al. | |
| 2007/0252703 A1 | 11/2007 | Kato et al. | |
| 2007/0285335 A1 | 12/2007 | Bungo et al. | |
| 2007/0290928 A1 | 12/2007 | Chang et al. | |
| 2008/0024156 A1 | 1/2008 | Arai et al. | |
| 2008/0087990 A1 | 4/2008 | Kato et al. | |
| 2008/0106412 A1 | 5/2008 | Sakama et al. | |
| 2008/0169905 A1 | 7/2008 | Slatter | |
| 2008/0252462 A1 | 10/2008 | Sakama | |
| 2008/0272885 A1 | 11/2008 | Atherton | |
| 2009/0002130 A1 | 1/2009 | Kato | |
| 2009/0009007 A1 | 1/2009 | Kato et al. | |
| 2009/0021446 A1 | 1/2009 | Kataya et al. | |
| 2009/0065594 A1 | 3/2009 | Kato et al. | |
| 2009/0109102 A1 | 4/2009 | Dokai et al. | |
| 2009/0160719 A1 | 6/2009 | Kato et al. | |
| 2009/0201116 A1 | 8/2009 | Orihara | |
| 2009/0224061 A1 | 9/2009 | Kato et al. | |
| 2009/0231106 A1 | 9/2009 | Okamura | |
| 2009/0262041 A1 | 10/2009 | Ikemoto et al. | |
| 2009/0278687 A1 | 11/2009 | Kato | |
| 2009/0321527 A1 | 12/2009 | Kato et al. | |
| 2010/0001393 A1* | 1/2010 | Danno et al. | 257/692 |
| 2011/0063184 A1 | 3/2011 | Furumura et al. | |

FOREIGN PATENT DOCUMENTS

| | | |
|---|---|---|
| EP | 0 694 874 A2 | 1/1996 |
| EP | 0 977 145 A2 | 2/2000 |
| EP | 1 010 543 A1 | 6/2000 |
| EP | 1 160 915 A2 | 12/2001 |
| EP | 1 170 795 A2 | 1/2002 |
| EP | 1 227 540 A1 | 7/2002 |
| EP | 1 280 232 A1 | 1/2003 |
| EP | 1 280 350 A1 | 1/2003 |
| EP | 1 343 223 A1 | 9/2003 |
| EP | 1 357 511 A2 | 10/2003 |
| EP | 1 548 872 A1 | 6/2005 |
| EP | 1 703 589 A1 | 9/2006 |
| EP | 1 744 398 A1 | 1/2007 |
| EP | 1 841 005 A1 | 10/2007 |
| EP | 1 865 574 A1 | 12/2007 |
| EP | 1 976 056 A1 | 10/2008 |
| EP | 1 993 170 A1 | 11/2008 |
| EP | 2 009 738 A1 | 12/2008 |
| EP | 2 012 258 A1 | 1/2009 |
| EP | 2 148 449 A1 | 1/2010 |
| EP | 2 251 934 A1 | 11/2010 |
| GB | 2 305 075 A | 3/1997 |
| JP | 50-143451 A | 11/1975 |
| JP | 62-127140 U | 8/1987 |
| JP | 02-164105 A | 6/1990 |
| JP | 03-262313 A | 11/1991 |
| JP | 04-150011 A | 5/1992 |
| JP | 04-167500 A | 6/1992 |
| JP | 05-327331 A | 12/1993 |
| JP | 6-53733 A | 2/1994 |
| JP | 06-077729 A | 3/1994 |
| JP | 06-177635 A | 6/1994 |

| | | | | | | | |
|---|---|---|---|---|---|---|---|
| JP | 6-260949 | A | 9/1994 | JP | 2001-514777 | A | 9/2001 |
| JP | 07-183836 | A | 7/1995 | JP | 2001-319380 | A | 11/2001 |
| JP | 08-056113 | A | 2/1996 | JP | 2001-331976 | A | 11/2001 |
| JP | 8-87580 | A | 4/1996 | JP | 2001-332923 | A | 11/2001 |
| JP | 08-88586 | A | 4/1996 | JP | 2001-339226 | A | 12/2001 |
| JP | 08-088586 | A | 4/1996 | JP | 2001-344574 | A | 12/2001 |
| JP | 11-149537 | A | 6/1996 | JP | 2001-351084 | A | 12/2001 |
| JP | 08-176421 | A | 7/1996 | JP | 2001-352176 | A | 12/2001 |
| JP | 08-180160 | A | 7/1996 | JP | 2002-024776 | A | 1/2002 |
| JP | 08-279027 | A | 10/1996 | JP | 2002-026513 | A | 1/2002 |
| JP | 08-307126 | A | 11/1996 | JP | 2002-32731 | A | 1/2002 |
| JP | 08-330372 | A | 12/1996 | JP | 2002-042076 | A | 2/2002 |
| JP | 09-014150 | A | 1/1997 | JP | 2002-063557 | A | 2/2002 |
| JP | 09-035025 | A | 2/1997 | JP | 2002-505645 | A | 2/2002 |
| JP | 9-93029 | A | 4/1997 | JP | 2002-76750 | A | 3/2002 |
| JP | 09-245381 | A | 9/1997 | JP | 2002-076750 | A | 3/2002 |
| JP | 09-252217 | A | 9/1997 | JP | 2002-150245 | A | 5/2002 |
| JP | 09-270623 | A | 10/1997 | JP | 2002-157564 | A | 5/2002 |
| JP | 9-512367 | A | 12/1997 | JP | 2002-158529 | A | 5/2002 |
| JP | 10-069533 | A | 3/1998 | JP | 2002-175508 | A | 6/2002 |
| JP | 10-69533 | A | 3/1998 | JP | 2002-183690 | A | 6/2002 |
| JP | 10-505466 | A | 5/1998 | JP | 2002-185358 | A | 6/2002 |
| JP | 10-171954 | A | 6/1998 | JP | 2002-204117 | A | 7/2002 |
| JP | 10-193849 | A | 7/1998 | JP | 2002-522849 | A | 7/2002 |
| JP | 10-193851 | A | 7/1998 | JP | 2002-230128 | A | 8/2002 |
| JP | 10-293828 | A | 11/1998 | JP | 2002-232221 | A | 8/2002 |
| JP | 11-039441 | A | 2/1999 | JP | 2002-252117 | A | 9/2002 |
| JP | 11-075329 | A | 3/1999 | JP | 2002-259934 | A | 9/2002 |
| JP | 11-085937 | A | 3/1999 | JP | 2002-280821 | A | 9/2002 |
| JP | 11-88241 | A | 3/1999 | JP | 2002-298109 | A | 10/2002 |
| JP | 11-102424 | A | 4/1999 | JP | 2002-308437 | A | 10/2002 |
| JP | 11-103209 | A | 4/1999 | JP | 2002-319008 | A | 10/2002 |
| JP | 11-149536 | A | 6/1999 | JP | 2002-319009 | A | 10/2002 |
| JP | 11-149538 | A | 6/1999 | JP | 2002-319812 | A | 10/2002 |
| JP | 11-219420 | A | 8/1999 | JP | 2002-362613 | A | 12/2002 |
| JP | 11-220319 | A | 8/1999 | JP | 2002-366917 | A | 12/2002 |
| JP | 11-328352 | A | 11/1999 | JP | 2002-373029 | A | 12/2002 |
| JP | 11-346114 | A | 12/1999 | JP | 2002-373323 | A | 12/2002 |
| JP | 11-515094 | A | 12/1999 | JP | 2002-374139 | A | 12/2002 |
| JP | 2000-21128 | A | 1/2000 | JP | 2003-006599 | A | 1/2003 |
| JP | 2000-021639 | A | 1/2000 | JP | 2003-016412 | A | 1/2003 |
| JP | 2000-022421 | A | 1/2000 | JP | 2003-022912 | A | 1/2003 |
| JP | 2005-229474 | A | 1/2000 | JP | 2003-026177 | A | 1/2003 |
| JP | 2000-059260 | A | 2/2000 | JP | 2003-030612 | A | 1/2003 |
| JP | 2000-085283 | A | 3/2000 | JP | 2003-44789 | A | 2/2003 |
| JP | 2000-090207 | A | 3/2000 | JP | 2003-046318 | A | 2/2003 |
| JP | 2000-132643 | A | 5/2000 | JP | 2003-58840 | A | 2/2003 |
| JP | 2000-137778 | A | 5/2000 | JP | 2003-067711 | A | 3/2003 |
| JP | 2000-137779 | A | 5/2000 | JP | 2003-069335 | A | 3/2003 |
| JP | 2000-137785 | A | 5/2000 | JP | 2003-076947 | A | 3/2003 |
| JP | 2000-148948 | A | 5/2000 | JP | 2003-76963 | A | 3/2003 |
| JP | 2000-172812 | A | 6/2000 | JP | 2003-78333 | A | 3/2003 |
| JP | 2000-209013 | A | 7/2000 | JP | 2003-078336 | A | 3/2003 |
| JP | 2000-222540 | A | 8/2000 | JP | 2003-085501 | A | 3/2003 |
| JP | 2000-510271 | A | 8/2000 | JP | 2003-085520 | A | 3/2003 |
| JP | 2000-242754 | A | 9/2000 | JP | 2003-87008 | A | 3/2003 |
| JP | 2000-243797 | A | 9/2000 | JP | 2003-87044 | A | 3/2003 |
| JP | 2000-251049 | A | 9/2000 | JP | 2003-099720 | A | 4/2003 |
| JP | 2000-261230 | A | 9/2000 | JP | 2003-099721 | A | 4/2003 |
| JP | 2000-276569 | A | 10/2000 | JP | 2003-110344 | A | 4/2003 |
| JP | 2000-286634 | A | 10/2000 | JP | 2003-132330 | A | 5/2003 |
| JP | 2000-286760 | A | 10/2000 | JP | 2003-134007 | A | 5/2003 |
| JP | 2000-311226 | A | 11/2000 | JP | 2003-155062 | A | 5/2003 |
| JP | 2000-321984 | A | 11/2000 | JP | 2003-158414 | A | 5/2003 |
| JP | 3075400 | U | 11/2000 | JP | 2003-168760 | A | 6/2003 |
| JP | 2000-349680 | A | 12/2000 | JP | 2003-179565 | A | 6/2003 |
| JP | 2001-10264 | A | 1/2001 | JP | 2003-187207 | A | 7/2003 |
| JP | 2001-028036 | A | 1/2001 | JP | 2003-187211 | A | 7/2003 |
| JP | 2007-18067 | A | 1/2001 | JP | 2003-188338 | A | 7/2003 |
| JP | 2001-043340 | A | 2/2001 | JP | 2003-188620 | A | 7/2003 |
| JP | 2001-66990 | A | 3/2001 | JP | 2003-198230 | A | 7/2003 |
| JP | 2001-76111 | A | 3/2001 | JP | 2003-209421 | A | 7/2003 |
| JP | 2001-101369 | A | 4/2001 | JP | 2003-216919 | A | 7/2003 |
| JP | 2001-505682 | A | 4/2001 | JP | 2003-218624 | A | 7/2003 |
| JP | 2001-168628 | A | 6/2001 | JP | 2003-233780 | A | 8/2003 |
| JP | 2001-188890 | A | 7/2001 | JP | 2003-242471 | A | 8/2003 |
| JP | 2001-240046 | A | 9/2001 | JP | 2003-243918 | A | 8/2003 |
| JP | 2001-256457 | A | 9/2001 | JP | 2003-249813 | A | 9/2003 |
| JP | 2001-257292 | A | 9/2001 | JP | 2003-529163 | A | 9/2003 |

| | | | | | | |
|---|---|---|---|---|---|---|
| JP | 2003-288560 A | 10/2003 | | JP | 2006-92630 A | 4/2006 |
| JP | 2003-309418 A | 10/2003 | | JP | 2006-102953 A | 4/2006 |
| JP | 2003-317060 A | 11/2003 | | JP | 2006-107296 A | 4/2006 |
| JP | 2003-331246 A | 11/2003 | | JP | 2006-513594 A | 4/2006 |
| JP | 2003-332820 A | 11/2003 | | JP | 2006-148462 A | 6/2006 |
| JP | 2003-536302 A | 12/2003 | | JP | 2006-148518 A | 6/2006 |
| JP | 2004-040597 A | 2/2004 | | JP | 2006-151402 A | 6/2006 |
| JP | 2004-505481 A | 2/2004 | | JP | 2006-174151 A | 6/2006 |
| JP | 2004-082775 A | 3/2004 | | JP | 2006-195795 A | 7/2006 |
| JP | 2004-88218 A | 3/2004 | | JP | 2006-203187 A | 8/2006 |
| JP | 2004-93693 A | 3/2004 | | JP | 2006-203852 A | 8/2006 |
| JP | 2004-096566 A | 3/2004 | | JP | 2006-217000 A | 8/2006 |
| JP | 2004-127230 A | 4/2004 | | JP | 2006-232292 A | 9/2006 |
| JP | 2004-140513 A | 5/2004 | | JP | 2006-237674 A | 9/2006 |
| JP | 2004-213582 A | 7/2004 | | JP | 2006-270212 A | 10/2006 |
| JP | 2004-519916 A | 7/2004 | | JP | 2006-270766 A | 10/2006 |
| JP | 2004-234595 A | 8/2004 | | JP | 2006-285911 A | 10/2006 |
| JP | 2004-253858 A | 9/2004 | | JP | 2006-293426 A | 10/2006 |
| JP | 2004-527864 A | 9/2004 | | JP | 2006-295879 A | 10/2006 |
| JP | 2004-280390 A | 10/2004 | | JP | 2006-302219 A | 11/2006 |
| JP | 2004-282403 A | 10/2004 | | JP | 2006-309401 A | 11/2006 |
| JP | 2004-287767 A | 10/2004 | | JP | 2006-311239 A | 11/2006 |
| JP | 2004-297249 A | 10/2004 | | JP | 2006-323481 A | 11/2006 |
| JP | 2004-297681 A | 10/2004 | | JP | 2006-339964 A | 12/2006 |
| JP | 2004-304370 A | 10/2004 | | JP | 2007-007888 A | 1/2007 |
| JP | 2004-319848 A | 11/2004 | | JP | 2007-13120 A | 1/2007 |
| JP | 2004-326380 A | 11/2004 | | JP | 2007-28002 A | 2/2007 |
| JP | 2004-334268 A | 11/2004 | | JP | 2007-043535 A | 2/2007 |
| JP | 2004-336250 A | 11/2004 | | JP | 2007-048126 A | 2/2007 |
| JP | 2004-343000 A | 12/2004 | | JP | 2007-65822 A | 3/2007 |
| JP | 2004-348235 A | 12/2004 | | JP | 2007-79687 A | 3/2007 |
| JP | 2004-355469 A | 12/2004 | | JP | 2007-81712 A | 3/2007 |
| JP | 2004-362190 A | 12/2004 | | JP | 2007-096768 A | 4/2007 |
| JP | 2004-362341 A | 12/2004 | | JP | 2007-102348 A | 4/2007 |
| JP | 2004-362602 A | 12/2004 | | JP | 2007-122542 A | 5/2007 |
| JP | 2005-5866 A | 1/2005 | | JP | 2007-150642 A | 6/2007 |
| JP | 2005-18156 A | 1/2005 | | JP | 2007-150868 A | 6/2007 |
| JP | 2005-124061 A | 5/2005 | | JP | 2007-159083 A | 6/2007 |
| JP | 2005-128592 A | 5/2005 | | JP | 2007-159129 A | 6/2007 |
| JP | 2005-129019 A | 5/2005 | | JP | 2007-166133 A | 6/2007 |
| JP | 2005-135132 A | 5/2005 | | JP | 2007-172369 A | 7/2007 |
| JP | 2005-136528 A | 5/2005 | | JP | 2007-172527 A | 7/2007 |
| JP | 2005-137032 A | 5/2005 | | JP | 2007-228325 A | 9/2007 |
| JP | 3653099 B2 | 5/2005 | | JP | 2007-266999 A | 10/2007 |
| JP | 2005-165839 A | 6/2005 | | JP | 2007-272264 A | 10/2007 |
| JP | 2005-167327 A | 6/2005 | | JP | 2007-287128 A | 11/2007 |
| JP | 2005-167813 A | 6/2005 | | JP | 2007-312350 A | 11/2007 |
| JP | 2005-190417 A | 7/2005 | | JP | 2007-324865 A | 12/2007 |
| JP | 2005-191705 A | 7/2005 | | JP | 2008-033716 A | 2/2008 |
| JP | 2005-210676 A | 8/2005 | | JP | 2008-72243 A | 3/2008 |
| JP | 2005-210680 A | 8/2005 | | JP | 2008-097426 A | 4/2008 |
| JP | 2005-217822 A | 8/2005 | | JP | 4069958 B2 | 4/2008 |
| JP | 2005-236339 A | 9/2005 | | JP | 2008-107947 A | 5/2008 |
| JP | 2005-244778 A | 9/2005 | | JP | 2008-117165 A | 5/2008 |
| JP | 2005-252853 A | 9/2005 | | JP | 2008-148345 A | 6/2008 |
| JP | 2005-275870 A | 10/2005 | | JP | 2008-519347 A | 6/2008 |
| JP | 2005-284352 A | 10/2005 | | JP | 2008-160874 A | 7/2008 |
| JP | 2005-293460 A | 10/2005 | | JP | 2008-263354 A | 10/2008 |
| JP | 2005-293537 A | 10/2005 | | JP | 11-175678 A | 1/2009 |
| JP | 2005-295135 A | 10/2005 | | JP | 2009-25870 A | 2/2009 |
| JP | 2005-311205 A | 11/2005 | | JP | 2009-27291 A | 2/2009 |
| JP | 2005-321305 A | 11/2005 | | JP | 2009-044715 A | 2/2009 |
| JP | 2005-322119 A | 11/2005 | | JP | 2009-295708 A | 12/2009 |
| JP | 2005-335755 A | 12/2005 | | JP | 2010-009196 A | 1/2010 |
| JP | 2005-340759 A | 12/2005 | | NL | 9100176 A | 3/1992 |
| JP | 2005-345802 A | 12/2005 | | NL | 9100347 A | 3/1992 |
| JP | 2005-346820 A | 12/2005 | | WO | 98/33142 A1 | 7/1998 |
| JP | 2005-352858 A | 12/2005 | | WO | 99/67754 A1 | 12/1999 |
| JP | 2006-013976 A | 1/2006 | | WO | 00/10122 A2 | 2/2000 |
| JP | 2006-13976 A | 1/2006 | | WO | 01/95242 A2 | 12/2001 |
| JP | 2006-025390 A | 1/2006 | | WO | 02/48980 A1 | 6/2002 |
| JP | 2006-031766 A | 2/2006 | | WO | 02/061675 A1 | 8/2002 |
| JP | 2006-39902 A | 2/2006 | | WO | 02/097723 A1 | 12/2002 |
| JP | 2006-42059 A | 2/2006 | | WO | 03/079305 A1 | 9/2003 |
| JP | 2006-42097 A | 2/2006 | | WO | 2004/036772 A1 | 4/2004 |
| JP | 2006-053833 A | 2/2006 | | WO | 2004/070879 A | 8/2004 |
| JP | 2006-67479 A | 3/2006 | | WO | 2004/072892 A1 | 8/2004 |
| JP | 2006-72706 A | 3/2006 | | WO | 2005/073937 A | 8/2005 |
| JP | 2006-80367 A | 3/2006 | | WO | 2005/091434 A1 | 9/2005 |

| | | | |
|---|---|---|---|
| WO | 2005/115849 A1 | 12/2005 | |
| WO | 2006/045682 A | 5/2006 | |
| WO | 2006/048663 A1 | 5/2006 | |
| WO | 2006/114821 A1 | 11/2006 | |
| WO | 2007/083574 A1 | 7/2007 | |
| WO | 2007/083575 A1 | 7/2007 | |
| WO | 2007/086130 A1 | 8/2007 | |
| WO | 2007/102360 A1 | 9/2007 | |
| WO | 2007/119310 A1 | 10/2007 | |
| WO | 2007/125683 A1 | 11/2007 | |
| WO | 2007/138857 A1 | 12/2007 | |
| WO | 2008/007606 A | 1/2008 | |
| WO | 2008/081699 A1 | 7/2008 | |
| WO | 2008/126458 A1 | 10/2008 | |
| WO | 2008/140037 A1 | 11/2008 | |
| WO | 2008/142957 A1 | 11/2008 | |
| WO | 2009/011376 A1 | 1/2009 | |
| WO | 2009/081719 A1 | 7/2009 | |
| WO | 2009/110381 A1 | 9/2009 | |

OTHER PUBLICATIONS

Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags"), RFID, pp. 112-126.
Dokai et al.: "Wireless IC Device and Component for Wireless IC Device"; U.S. Appl. No. 11/624,382, filed Jan. 18, 2007.
Dokai et al.: "Wireless IC Device, and Component for Wireless IC Device"; U.S. Appl. No. 11/930,818, filed Oct. 31, 2007.
Kato et al.: "Wireless IC Device"; U.S. Appl. No. 12/042,399, filed Mar. 5, 2008.
Official communication issued in related U.S. Appl. No. 12/042,399; mailed on Aug. 25, 2008.
Official Communication issued in International Application No. PCT/JP2007/066007, mailed on Nov. 27, 2007.
Dokai et al.: "Wireless IC Device and Component for Wireless IC Device"; U.S. Appl. No. 12/359,690, filed Jan. 26, 2009.
Dokai et al.: "Test System for Radio Frequency IC Devices and Method of Manufacturing Radio Frequency IC Devices Using the Same"; U.S. Appl. No. 12/388,826, filed Feb. 19, 2009.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Kato et al.: "Wireless IC Device"; U.S. Appl. No. 12/390,556, filed Feb. 23, 2009.
Kato et al.: "Inductively Coupled Module and Item With Inductively Coupled Module"; U.S. Appl. No. 12/398,497, filed Mar. 5, 2009.
Official Communication issued in International Patent Application No. PCT/JP2008/050945, mailed on May 1, 2008.
Kato et al.: "Article Having Electromagnetic Coupling Module Attached Thereto"; U.S. Appl. No. 12/401,767, filed Mar. 11, 2009.
Taniguchi et al.: "Antenna Device and Radio Frequency IC Device"; U.S. Appl. No. 12/326,117, filed Dec. 2, 2008.
Official Communication issued in International Patent Application No. PCT/JP2008/061442, mailed on Jul. 22, 2008.
Kato et al.: "Container With Electromagnetic Coupling Module"; U.S. Appl. No. 12/426,369, filed Apr. 20, 2009.
Kato: "Wireless IC Device"; U.S. Appl. No. 12/429,346, filed Apr. 24, 2009.
Official Communication issued in International Patent Application No. PCT/JP2009/069486, mailed on Mar. 2, 2010.
Kato: "Radio IC Device"; U.S. Appl. No. 13/080,775, filed Apr. 6, 2011.
Kato et al.: "Antenna and Wireless IC Device"; U.S. Appl. No. 13/083,626, filed Apr. 11, 2011.
Official Communication issued in International Patent Application No. PCT/JP2009/070617, mailed on Mar. 16, 2010.

Nagai, "Mounting Technique of RFID by Roll-To-Roll Process", Material Stage, Technical Information Institute Co., Ltd, vol. 7, No. 9, 2007, pp. 4-12.
Dokai et al.: "Wireless IC Device"; U.S. Appl. No. 13/088,480, filed Apr. 18, 2011.
Kato et al.: "High-Frequency Device and Wireless IC Device"; U.S. Appl. No. 13/094,928, filed Apr. 27, 2011.
Dokai et al.: "Wireless IC Device"; U.S. Appl. No. 13/099,392, filed May 3, 2011.
Kato et al.: "Radio Frequency IC Device"; U.S. Appl. No. 13/163,803, filed Jun. 20, 2011.
Official Communication issued in International Patent Application No. PCT/JP2010/050170, mailed on Apr. 13, 2010.
Official Communication issued in International Patent Application No. PCT/JP2010/051205, mailed on May 11, 2010.
Kato: "Wireless IC Device, Wireless IC Module and Method of Manufacturing Wireless IC Module"; U.S. Appl. No. 13/169,067, filed Jun. 27, 2011.
Kato et al.: "Antenna and Wireless IC Device"; U.S. Appl. No. 13/190,670, filed Jul. 26, 2011.
Official Communication issued in International Patent Application No. PCT/JP2008/063025, mailed on Aug. 12, 2008.
Kato et al.: "Wireless IC Device," U.S. Appl. No. 12/603,608, filed Oct. 22, 2009.
Kato et al.: "Wireless IC Device,"U.S. Appl. No. 12/688,072, filed Jan. 15, 2010.
Official Communication issued in International Patent Application No. PCT/JP2009/053693, mailed on Jun. 9, 2009.
Kato: "Composite Antenna," U.S. Appl. No. 12/845,846, filed Jul. 29, 2010.
Official Communication issued in International Patent Application No. PCT/JP2009/053690, mailed on Jun. 2, 2009.
Kato et al.: "Radio Frequency IC Device and Radio Communication System," U.S. Appl. No. 12/859,340, filed Aug. 19, 2010.
Official Communication issued in International Patent Application No. PCT/JP2009/055758, mailed on Jun. 23, 2009.
Kato et al.: "Wireless IC Device," U.S. Appl. No. 12/859,880, filed Aug. 20, 2010.
Official Communication issued in International Patent Application No. PCT/JP2009/057482, mailed on Jul. 21, 2009.
Kataya et al.: "Wireless IC Device, Electronic Apparatus, and Method for Adjusting Resonant Frequency of Wireless IC Device," U.S. Appl. No. 12/861,945, filed Aug. 24, 2010.
Kato: "Wireless IC Device and Electromagnetic Coupling Module," U.S. Appl. No. 12/890,895, filed Sep. 27, 2010.
Official Communication issued in International Patent Application No. PCT/JP2009/059410, mailed on Aug. 4, 2009.
Kato et al.: "Wireless IC Device" U.S. Appl. No. 12/902,174, filed Oct. 12, 2010.
Official Communication issued in International Patent Application No. PCT/JP2009/059259, mailed on Aug. 11, 2009.
Official Communication issued in corresponding Japanese Patent Application No. 2010-506742, mailed on Apr. 6, 2010.
Official Communication issued in International Patent Application No. PCT/JP20091056698, mailed on Jul. 7, 2009.
Official communication issued in counterpart International Application No. PCT/JP2008/071502, mailed Feb. 24, 2009.
Kato et al.: "Wireless IC Device and Manufacturing Method Thereof," U.S. Appl. No. 12/432,854, filed Apr. 30, 2009.
Official communication issued in counterpart International Application No. PCT/JP2008/058168, mailed Aug. 12, 2008.
Official communication issued in counterpart International Application No. PCT/JP2008/062886, mailed Oct. 21, 2008.
Kato et al.: "Wireless IC Device," U.S. Appl. No. 12/469,896, filed May 21, 2009.
Ikemoto et al.: "Wireless IC Device," U.S. Appl. No. 12/496,709, filed Jul. 2, 2009.
Official communication issued in counterpart International Application No. PCT/JP2008/062947, mailed Aug. 19, 2008.
Official communication issued in counterport International Application No. PCT/JP2008/056026, mailed Jul. 1, 2008.
Ikemoto et al.: "Wireless IC Device and Electronic Apparatus," U.S. Appl. No. 12/503,188, filed Jul. 15, 2009.

Official communication issued in counterpart International Application No. PCT/JP2008/055567, mailed May 20, 2008.
Official communication issued in counterpart International Application No. PCT/JP2008/051853, mailed Apr. 22, 2008.
Official communication issued in counterpart International Application No. PCT/JP2008/057239, mailed Jul. 22, 2008.
Kimura et al.: "Wireless IC Device," U.S. Appl. No. 12/510,338, filed Jul. 28, 2009.
Kato et al.: "Wireless IC Device," U.S. Appl. No. 12/510,340, filed Jul. 28, 2009.
Kato: "Wireless IC Device," U.S. Appl. No. 12/510,344, filed Jul. 28, 2009.
Kato et al.: "Wireless IC Device," U.S. Appl. No. 12/510,347, filed Jul. 28, 2009.
English translation of NL9100176, published on Mar. 2, 1992.
English translation of NL9100347, published on Mar. 2, 1992.
Kato et al.: "Antenna"; U.S. Appl. No. 11/928,502, filed Oct. 30, 2007.
Kato et al.: "Wireless IC Device"; U.S. Appl. No. 12/211,117, filed Sep. 16, 2008.
Kato et al.: "Antenna"; U.S. Appl. No. 11/688,290, filed Mar. 20, 2007.
Kato et al.: "Electromagnetic-Coupling-Module-Attached Article"; U.S. Appl. No. 11/740,509, filed Apr. 26, 2007.
Kato et al.: "Product Including Power Supply Circuit Board"; U.S. Appl. No. 12/234,949, filed Sep. 22, 2008.
Kato et al.: "Data Coupler"; U.S. Appl. No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444; filed Nov. 24, 2008.
Dokai et al.: "Optical Disc"; U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400, filed Nov. 20, 2008.
Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kato et al.: "Wireless IC Device and Component for Wireless IC Device"; U.S. Appl. No. 12/339,198, filed Dec. 19, 2008.
Ikemoto et al.: "Wireless IC Device"; U.S. Appl. No. 11/851,651, filed Sep. 7, 2007.
Kataya et al.: "Wireless IC Device and Electronic Device"; U.S. Appl. No. 11/851,661, filed Sep. 7, 2007.
Dokai et al.: "Antenna and Radio IC Device"; U.S. Appl. No. 12/350,307, filed Jan. 8, 2009.
Official Communication issued in International Patent Application No. PCT/JP2009/056934, mailed on Jun. 30, 2009.
Kato et al.: "Wireless IC Device"; U.S. Appl. No. 12/903,242, filed Oct. 13, 2010.
Kato et al.: "Wireless IC Device"; U.S. Appl. No. 12/940,103, filed Nov. 5, 2010.
Kato et al.: "Wireless IC Device System and Method of Determining Authenticity of Wireless IC Device"; U.S. Appl. No. 12/940,105, filed Nov. 5, 2010.
Official Communication issued in International Patent Application No. PCT/JP2009/059669, mailed on Aug. 25, 2009.
Official Communication issued in International Patent Application No. PCT/JP2009/062181, mailed on Oct. 13, 2009.
Official Communication issued in corresponding Japanese Application No. 2010-501323, mailed on Apr. 6, 2010.
Kato et al.: "Component of Wireless IC Device and Wireless IC Device"; U.S. Appl. No. 12/944,099, filed Nov. 11, 2010.
Kato et al.: Wireless IC Device and Manufacturing Method Thereof; U.S. Appl. No. 12/961,599, filed Dec. 7, 2010.
Kataya et al.: "Radio Frequency IC Device and Electronic Apparatus"; U.S. Appl. No. 12/959,454, filed Dec. 3, 2010.
Ikemoto et al.:"Radio IC Device"; U.S. Appl. No. 12/981,582, filed Dec. 30, 2010.
Official Communication issued in International Patent Application No. PCT/JP2009/062801, mailed on Oct. 27, 2009.
Ikemoto et al.: "Wireless IC Device and Electronic Apparatus"; U.S. Appl. No. 13/022,695, filed Feb. 8, 2011.
Official Communication issued in International Patent Application No. PCT/JP2009/067778, mailed on Jan. 26, 2010.
Kato: "Wireless IC Device and Method for Manufacturing Same"; U.S. Appl. No. 13/022,693, filed Feb. 8, 2011.
Kato: "Wireless IC Device"; U.S. Appl. No. 13/080,781, filed Apr. 6, 2011.
Official communication issued in counterpart European Application No. 08 77 7758, dated on Jun. 30, 2009.
Official communication issued in counterpart Japanese Application No. 2008-103741, mailed on May 26, 2009.
Official communication issued in counterpart Japanese Application No. 2008-103742, mailed on May 26, 2009.
Official communication issued in International Application No. PCT/JP2008/050358, mailed on Mar. 25, 2008.
Official communication issued in International Application No. PCT/JP2008/050356, mailed Mar. 25, 2008.
Osamura et al.: "Packaging Material With Electromagnetic Coupling Module," U.S. Appl. No. 12/536,663, filed Aug. 6, 2009.
Osamura et al.: "Packaging Material With Electromagnetic Coupling Module," U.S. Appl. No. 12/536,669, filed Aug. 6, 2009.
Dokai et al.: "Wireless IC Device and Component for Wireless IC Device," U.S. Appl. No. 12/543,553, filed Aug. 19, 2009.
Shioya et al.: "Wireless IC Device," U.S. Appl. No. 12/551,037, filed Aug. 31, 2009.
Ikemoto et al.: "Wireless IC Device and Manufacturing Method Thereof," U.S. Appl. No. 12/579,672, filed Oct. 15, 2009.
Official communication issued in International Application No. PCT/JP2008/058614, mailed on Jun. 10, 2008.
Official Communication issued in corresponding Japanese Patent Application No. 2010-197807, mailed on Dec. 4, 2012.

* cited by examiner

RFIC CHIP MOUNTING STRUCTURE

BACKGROUND OF THE INVENTION

1. Field of the Invention

The present invention relates to a mounting structure for an RFIC (Radio Frequency Integrated Circuit) chip included in, e.g., an RFIC device, such as a non-contact RFIC medium or a non-contact RFIC tag, which is used in an RFID (Radio Frequency Identification) system, for example.

2. Description of the Related Art

As an article management system, there is an RFID system for carrying out communication between an RFID tag and a reader/writer in a non-contact manner and transmitting information between the RFID tag and the reader/writer.

The RFID tag is made up of an RFIC chip in which ID information is written, and an antenna for transmitting and receiving an RF signal with respect to the RFID chip. As described in Japanese Unexamined Patent Application Publication No. 2010-009196, for example, the RFIC chip includes two input/output terminals and two dummy terminals, i.e., four terminals in total. A substrate for mounting the RFIC chip thereon also includes four mounting lands corresponding to the four terminals of the RFIC chip.

Figure 1:
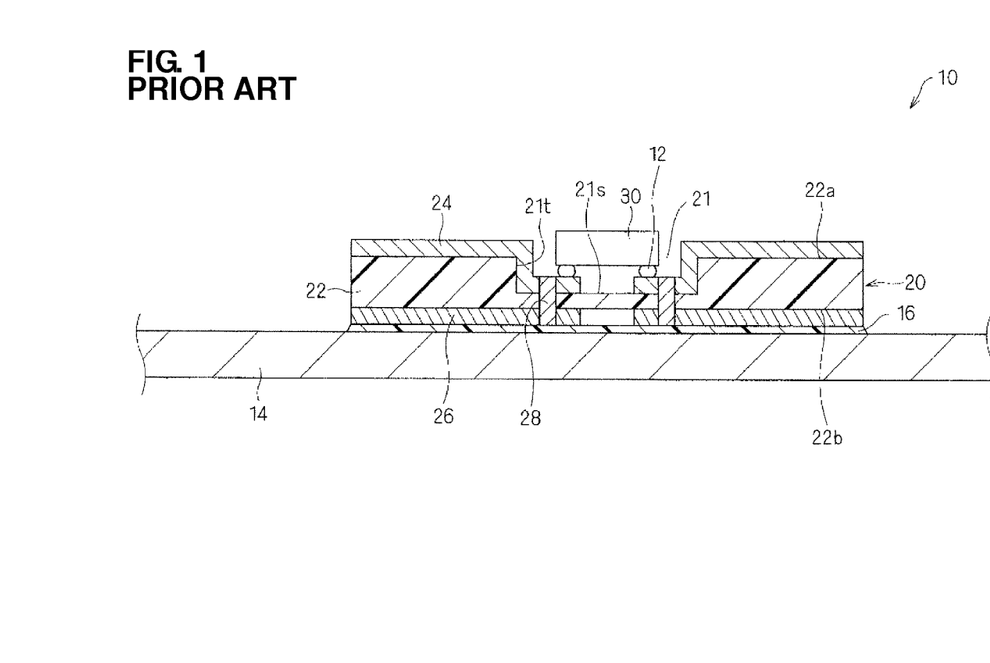
FIG. 1 is a sectional view of an RFIC device disclosed in Japanese Unexamined Patent Application Publication No. 2010-009196.

One example of an RFIC device disclosed in the above-cited Japanese Unexamined Patent Application Publication No. 2010-009196 is illustrated in FIG. 1. FIG. 1 is a sectional view of an RFIC device 10. A module component 20 including an RFIC chip 30 mounted in a recess 21 of a substrate 22 is bonded to a radiation plate 14 with a bonding material 16, e.g., an insulating adhesive sheet or adhesive, interposed therebetween. The radiation plate 14 is formed in a predetermined shape by using an electroconductive material.

The substrate 22 is made of a resin material. The recess 21 of the substrate 22 is formed by pressing the substrate 22. A wiring pattern 24 is formed not only on an upper surface 22a of the substrate 22, which is one principal surface thereof, but also along an inner peripheral surface 21t and a bottom surface 21s of the recess 21. A wiring pattern 26 is formed along a lower surface 22b of the substrate 22, which is the other principal surface thereof.

The RFIC chip 30 is mounted onto the wiring pattern formed along the bottom surface 21s of the recess 21 with a bump 12 interposed therebetween.

Input/output terminals and dummy terminals of the RFIC chip 30 are connected to the wiring pattern to which through-conductors 28 are connected.

Meanwhile, a thin and flexible mounting substrate, e.g., the so-called flexible substrate, has recently been often used as a substrate for mounting the RFIC chip thereon in order to reduce the size and thickness of the RFIC device. Because the flexible substrate is thin and flexible, it is highly adaptable for a thin-model RFIC device.

However, when stress is exerted on the mounting substrate causing, e.g., warping or bending of the RFIC device, there is a risk that the stress may be applied to the RFIC chip and the RFIC chip may be cracked or broken.

SUMMARY OF THE INVENTION

Accordingly, preferred embodiments of the present invention provide an RFIC chip mounting structure, which reduces and minimizes stress applied to the RFIC chip and which ensures high reliability of an RFIC device.

According to a preferred embodiment of the present invention, an RFIC chip mounting structure for an RFIC chip mounted to a mounting substrate includes a plurality of external terminals including an RF (i.e., Radio Frequency) terminal and an NC (i.e., Not Connected or electrically independent) terminal, and the mounting substrate includes a flexible base and a plurality of mounting lands provided on a surface of the flexible base corresponding to the plurality of external terminals. At least one of the plurality of mounting lands is a shared mounting land to which are connected the RF terminal and the NC terminal in common. The shared mounting land is preferably arranged to cover at least one side of the RFIC chip when viewed from above.

With the structure described above, even when the mounting substrate undergoes stress applied from the outside, the shared mounting land relieves the stress that is going to be exerted on the RFIC chip. As a result, protection performance of the RFIC chip is increased even with the mounting substrate having flexibility.

When the shared mounting land is arranged to cover two adjacent sides of the RFIC chip when viewed from above, for example, the protection performance of the RFIC chip is further increased.

The mounting substrate may include a plurality of external connection terminal electrodes, which are provided on a lower surface of the mounting substrate and which are electrically connected to the mounting lands, and at least one of the plurality of external connection terminal electrodes may be arranged to cover at least one side of the RFIC chip when viewed from above. With that arrangement, even when the mounting substrate undergoes stress applied from the outside, the external connection terminal electrode, which is arranged to cover at least one side of the RFIC chip when viewed from above, relieves the stress that is going to be exerted on the RFIC chip. As a result, the protection performance of the RFIC chip is increased even with the mounting substrate having flexibility.

Further, when the plurality of external terminals of the RFIC chip and the mounting lands of the mounting substrate are joined to each other by melting (fusion) of metal particles or solidification of an electroconductive paste, the metal particles are less apt to spread with wetting during the joining, the RFIC chip is less susceptible to tilting, and hence stable mounting can be ensured even with the mounting land being in the form of an integrated land having a relatively large area.

According to various preferred embodiments of the present invention, an RFIC device can be obtained which is thin and highly-reliable, and which can prevent the RFIC chip from being cracked or broken when the mounting substrate undergoes the stress applied from the outside.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 2A to 2C illustrate an RFIC chip mounting structure according to a first preferred embodiment of the present invention; specifically.

FIGS. 4A to 4C illustrate an RFIC chip mounting structure according to a second preferred embodiment of the present invention; specifically.

DETAILED DESCRIPTION OF THE PREFERRED EMBODIMENTS

First Preferred Embodiment

Figure 2A:
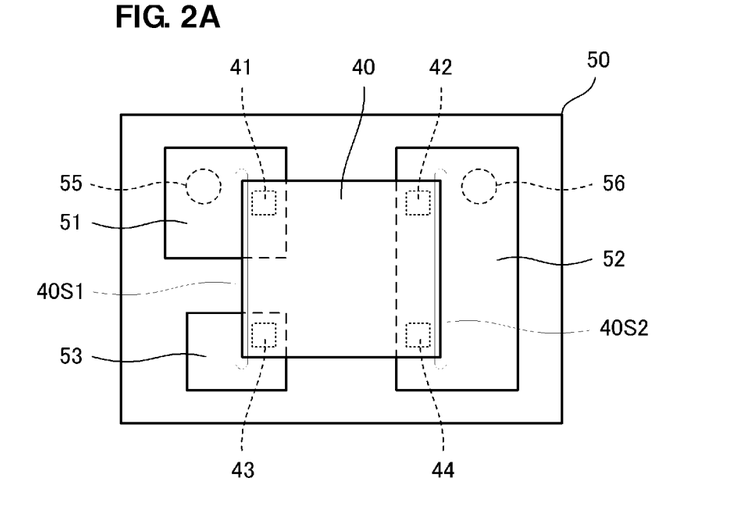
FIG. 2A is a plan view of an RFIC module in a state where an encapsulation resin layer is not formed.
Figure 2B:
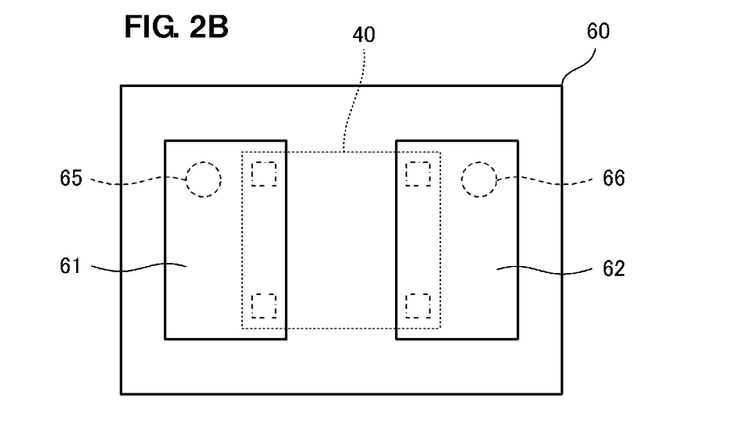
FIG. 2B is a bottom view of the RFIC module.
Figure 2C:
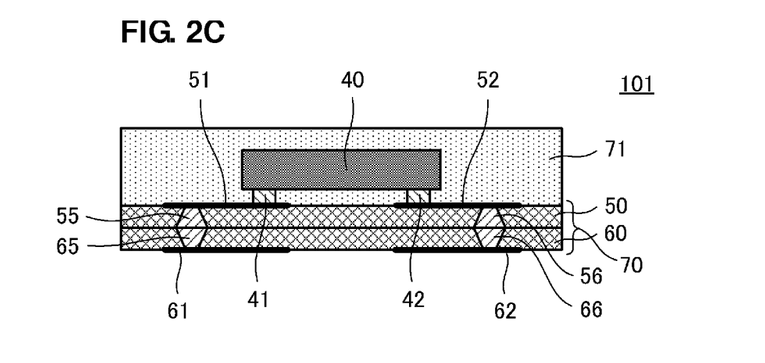
FIG. 2C is a sectional view of the RFIC module after being encapsulated with a resin.

FIGS. 2A to 2C illustrate an RFIC chip mounting structure according to a first preferred embodiment. Specifically, FIG. 2A is a plan view of an RFIC module 101 in a state where an encapsulation resin layer is not formed, FIG. 2B is a bottom view of the RFIC module 101, and FIG. 2C is a sectional view of the RFIC module 101 after being encapsulated with a resin.

In the RFIC module 101, as illustrated in FIG. 2C, an RFIC chip 40 is mounted to a mounting substrate 70 and is encapsulated with an encapsulation resin layer 71. The mounting substrate 70 preferably includes flexible bases 50 and 60 and various electrodes located on those flexible bases.

The RFIC chip 40 preferably is a rectangular or substantially rectangular semiconductor integrated circuit chip including a memory circuit in which ID information is written, a logic circuit, a communication circuit, etc. A plurality of external terminals 41, 42, 43 and 44 are disposed respectively near four corners of a mounting surface of the RFIC chip 40. More specifically, the external terminals are constituted as RF terminals 41 and 42 for inputting/outputting of an RF signal, a test terminal 43, and an NC terminal (blank terminal) 44. The memory circuit and the logic circuit are connected to the RF terminals 41 and 42 through the communication circuit. The NC terminal 44 is not connected to a predetermined functional block and is electrically floating. The test terminal 43 serves as a terminal to which an inspection device is connected when characteristics of the RFIC chip 40 are inspected.

Mounting lands 51, 52 and 53 provided to mount the RFIC chip 40 are located on the surface of the flexible base 50. The RF terminal 41 of the RFIC chip 40 is connected to one 51 of the mounting lands 51, 52 and 53, the RF terminal 42 and the NC terminal 44 of the RFIC chip 40 are connected to the mounting land 52, and the RF terminal 43 of the RFIC chip 40 is connected to the mounting land 53. Thus, the mounting land 52 is a shared mounting land preferably in the form of an integrated mounting land that is shared by the RF terminal 42 and the NC terminal 44 of the RFIC chip 40. The shared mounting land 52 is preferably arranged to cover one side 40S2 of the RFIC chip 40 when viewed from above.

As illustrated in FIG. 2B, external connection terminal electrodes 61 and 62 are disposed on one surface of the flexible base 60 (i.e., on a lower surface of the mounting substrate 70 in a state illustrated in FIG. 2C). The external connection terminal electrodes 61 and 62 are electrically connected to the mounting lands 51 and 52, respectively, through via conductors 65 and 66 provided in the flexible base 60 and via conductors 55 and 56 provided in the flexible base 50.

The external connection terminal electrode 61 on the lower surface of the mounting substrate 70 is preferably arranged to cover one side 40S1 of the RFIC chip 40 when viewed from above. Also, the external connection terminal electrode 62 is preferably arranged to cover the one side 40S2 of the RFIC chip 40 when viewed from above.

In the above-described structure, the mounting lands 51, 52 and 53 have higher rigidity than the flexible bases 50 and 60, and the shared mounting land 52 is preferably arranged to cover the one side 40S2 of the RFIC chip 40 when viewed from above. Therefore, even when the mounting substrate 70 undergoes stress applied from the outside, the shared mounting land 52 relieves the stress that is going to be exerted on the RFIC chip 40. As a result, protection performance of the RFIC chip 40 is increased.

Further, in this preferred embodiment, the external connection terminal electrodes 61 and 62 having higher rigidity than the flexible bases 50 and 60 are preferably arranged respectively to cover the sides 40S1 and 40S2 of the RFIC chip 40 when viewed from above. Therefore, even when the mounting substrate 70 undergoes stress applied from the outside, the external connection terminal electrodes 61 and 62, which preferably are arranged to cover the sides 40S1 and 40S2 of the RFIC chip 40 when viewed from above, relieve the stress that is going to be exerted on the RFIC chip 40. As a result, the protection performance of the RFIC chip 40 is further increased.

The flexible bases 50 and 60 can be each made of, e.g., a thermosetting resin such as polyethylene terephthalate (PET), or a thermoplastic resin such as polyimide (PI) or a liquid crystal polymer (LCP). Each of the flexible bases 50 and 60 preferably has a thickness of about 25 μm to about 50 μm, for example. The mounting lands 51, 52 and 53 disposed on the flexible base 50 and the external connection terminal electrodes 61 and 62 disposed on the flexible base 60 can be each formed by pattering a metal foil, which is made of, e.g., silver, copper or aluminum, into a predetermined pattern, for example. Each of the mounting lands 51, 52 and 53 and the external connection terminal electrodes 61 and 62 has a thickness of, e.g., about 10 μm to about 40 μm, for example. The via conductors 55 and 56 in the flexible base 50 and the via conductors 65 and 66 in the flexible base 60 can be formed by filling an electroconductive paste, which is primarily made of a metal such as silver or copper, in respective via holes and by heat-treating the electroconductive paste, for example.

Further, the external terminals 41 to 44 of the RFIC chip 40 are joined to the mounting lands 51, 52 and 53 of the mounting substrate 70 preferably by using an electroconductive paste that contains metal particles made of, e.g., silver or copper and having a very small mean particle size. In general, a semiconductor chip and a mounting land are joined to each other by soldering. However, because the shared mounting land 52 has a relatively large area, a solder is apt to spread due to wetting during reflow soldering, thus causing the so-called tombstone phenomenon that the RFIC chip 40 may be tilted or raised up. On the other hand, when the electroconductive paste is used for joining the chip to the land as described above, the metal particles are less apt to spread due to wetting. Therefore, even with the mounting land having a large area, the RFIC chip 40 is less susceptible to tilting, etc. Further, when very small metal particles are used, the metal particles are aggregated with necking under heating that is performed for joining the RFIC chip to the mounting substrate 70, whereby the joining is effectuated. Once the joining is completely effectuated, the metal particles are not melted even when they are reheated in a soldering process for mounting the RFIC module 101.

Additionally, the external terminals and the mounting lands may be joined to each other with solidification of an electroconductive paste (electroconductive resin).

In the preferred embodiment illustrated in FIGS. 2A to 2C, the mounting lands 51, 52 and 53 are arranged preferably in a rotationally asymmetric relation when viewed from above. Therefore, when the RFIC chip 40 is mounted to the mounting substrate 70, the orientation of the mounting substrate 70 can be identified based on the arrangement of the mounting lands 51, 52 and 53, and a pattern used to identify the orientation of the mounting substrate 70 is not required to be separately provided.

While FIGS. 2A to 2C illustrate the state where the RFIC module is cut out as a single module, multiple modules are formed on a board when actually manufactured. In more detail, RFIC chips are mounted to many zones of the flexible base 50 in the mother state, which are arrayed in the vertical and horizontal directions. After entirely encapsulating the board with a resin, the board is cut per element into individual modules.

Figure 3A:
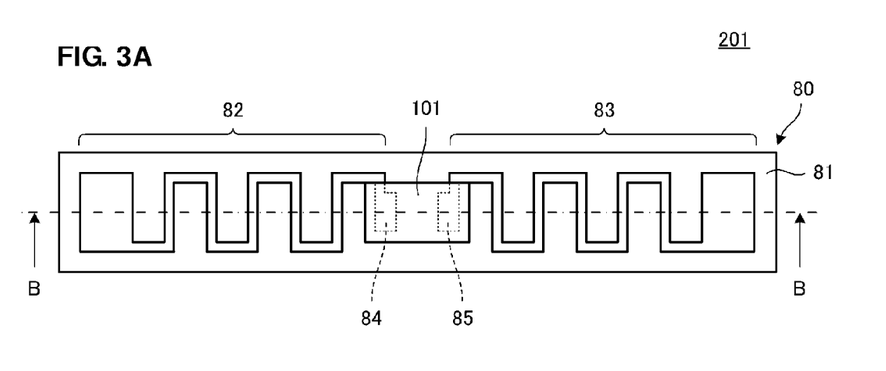
FIG. 3A is a plan view of an RFIC device including the RFIC module illustrated in FIGS. 2A to 2C.

FIG. 3A is a plan view of an RFIC device 201 including the RFIC module 101 illustrated in FIGS. 2A to 2C, and FIG. 3B is a sectional view taken along a line IIIB-IIIB in FIG. 3A. The RFIC device 201 is used, for example, as an RFID tag for a UHF band.

Figure 3B:
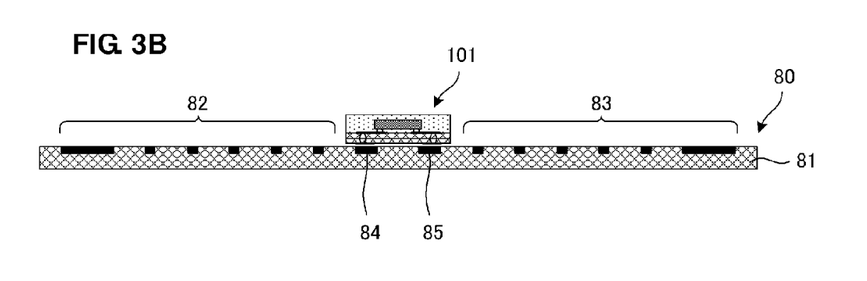
FIG. 3B is a sectional view taken along a line IIIB-IIIB in FIG. 3A.

The RFIC device 201 includes an antenna sheet 80 that is fabricated preferably by forming, on a flexible base 81 made of, e.g., PET, radiation electrodes 82 and 83 and RFIC module mounting lands 84 and 85 each made of, e.g., an aluminum foil. External connection terminal electrodes (61 and 62 illustrated in FIGS. 2B) of the RFIC module 101 are joined to the RFIC module mounting lands 84 and 85 on the antenna sheet 80. The RFIC device 201 can be used as an inlay-type RFID tag, for example.

According to the first preferred embodiment, as described above, even when the mounting substrate is flexed to some extent by external stress, the protection performance of the RFIC chip can be increased. It is hence possible to prevent cracking and breakage of the RFIC chip, and to obtain the RFIC module with higher reliability. Further, because of one of the mounting lands of the RFIC chip being formed as the shared mounting land, even when the external terminals of the RFIC chip 40 are arranged at a narrower gap (narrower pitch), the mounting lands on the mounting substrate side are not required to be formed at a narrower gap (narrower pitch). As a result, patterning of the mounting lands can be facilitated.

Second Preferred Embodiment

Figure 4A:
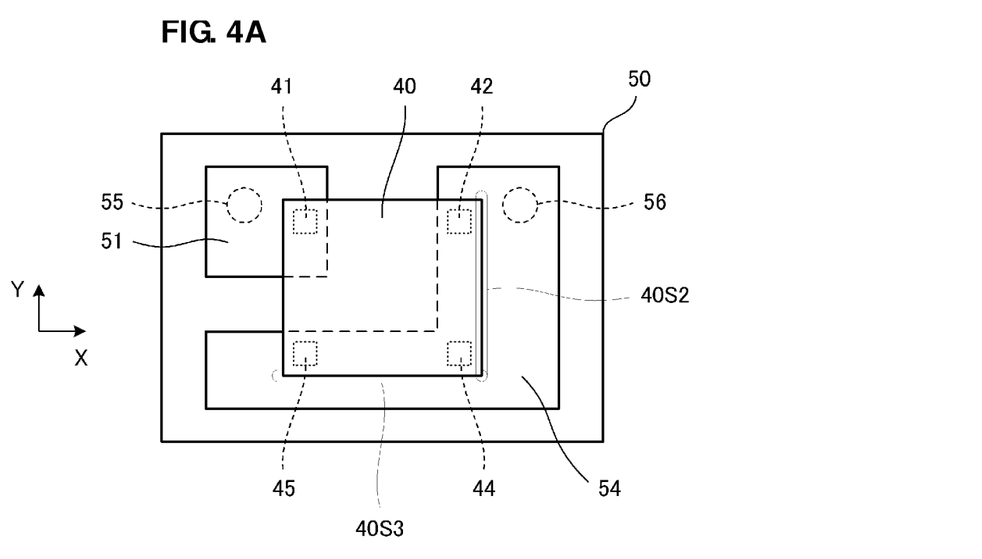
FIG. 4A is a plan view of an RFIC module in a state where an encapsulation resin layer is not formed.
Figure 4B:
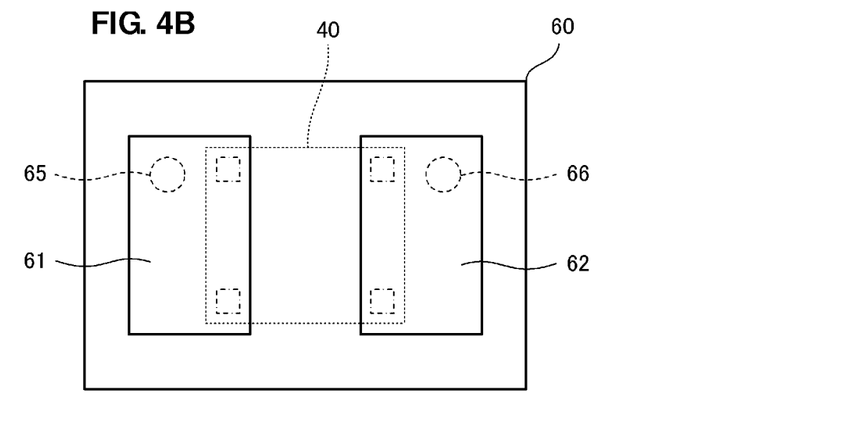
FIG. 4B is a bottom view of the RFIC module.
Figure 4C:
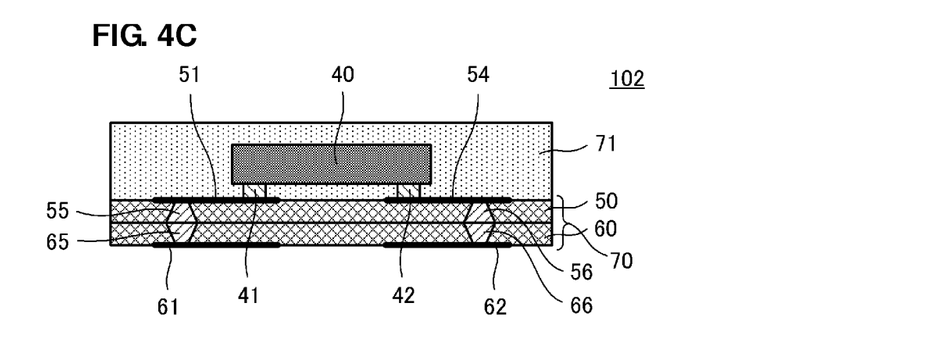
FIG. 4C is a sectional view of the RFIC module after being encapsulated with a resin.

FIGS. 4A to 4C illustrate an RFIC chip mounting structure according to a second preferred embodiment. Specifically, FIG. 4A is a plan view of an RFIC module 102 in a state where an encapsulation resin layer is not formed, FIG. 4B is a bottom view of the RFIC module, and FIG. 4C is a sectional view of the RFIC module 102 after being encapsulated with a resin.

The RFIC module 102 differs from the RFIC module 101 according to the first preferred embodiment, illustrated in FIGS. 2A to 2C, in the shapes of mounting lands for mounting the RFIC chip 40 and the external terminals of the RFIC chip 40. As appearing in FIG. 4A, mounting lands 51 and 54 for mounting the RFIC chip 40 are provided on the surface of the flexible base 50. An RF terminal 41 of the RFIC chip 40 is connected to one 51 of the mounting lands 51 and 54, and an RF terminal 42 and NC terminals 44 and 45 of the RFIC chip 40 are connected to the mounting land 54. Thus, the mounting land 54 is a shared mounting land in the form of an integrated mounting land that is shared by the RF terminal 42 and the NC terminals 44 and 45 of the RFIC chip 40. The shared mounting land 54 is preferably arranged to cover two sides 40S2 and 40S3 of the RFIC chip 40 when viewed from above. The other construction is preferably the same as that in the first preferred embodiment.

Since the shared mounting land 54 is preferably arranged to cover the two sides of the RFIC chip 40 when viewed from above, the protection performance of the RFIC chip can be increased against warping and bending even in both the X- and Y-directions. It is hence possible to prevent cracking and breakage of the RFIC chip, and to obtain the RFIC module with higher reliability.

Third Preferred Embodiment

Figure 5A:
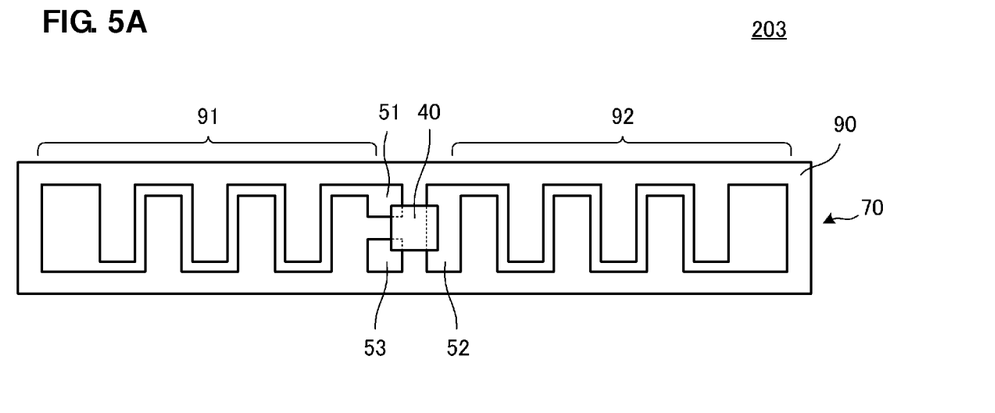
FIG. 5A is a plan view of an RFIC device according to a third preferred embodiment of the present invention.
Figure 5B:
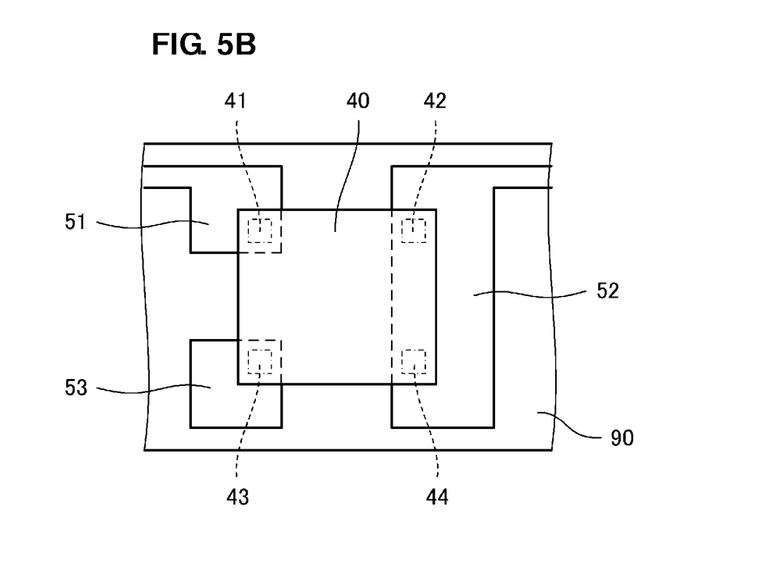
FIG. 5B is an enlarged view of a central portion of the RFIC device.

FIG. 5A is a plan view of an RFIC device 203 according to a third preferred embodiment, and FIG. 5B is an enlarged view of a central portion of the RFIC device 203.

The RFIC device 203 includes a mounting substrate that is constituted by forming, on a flexible base 90 made of, e.g., PET, radiation electrodes 91 and 92 and mounting lands 51, 52 and 53 each made of, e.g., an aluminum foil. The external terminals 41, 42, 43 and 44 of the RFIC chip 40 are joined to the mounting lands 51, 52 and 53 on the mounting substrate 70. The RFIC device 203 can be used as an RFID tag for a UHF band, for example.

While, in the first preferred embodiment, the RFIC module constituted by mounting the RFIC chip to the mounting substrate is preferably mounted to the antenna sheet, the RFIC chip 40 preferably is directly mounted to the flexible base 90 in the third preferred embodiment. In other words, the radiation electrodes are directly disposed on the mounting substrate.

Thus, the present invention can be similarly applied to the case where the RFIC chip is directly mounted to the mounting lands.

Fourth Preferred Embodiment

A fourth preferred embodiment relates to examples of an RFIC device, which includes a radiation electrode including a loop coil and which is suitable for use as an RFID tag in an HF band, for example.

Figure 6A:
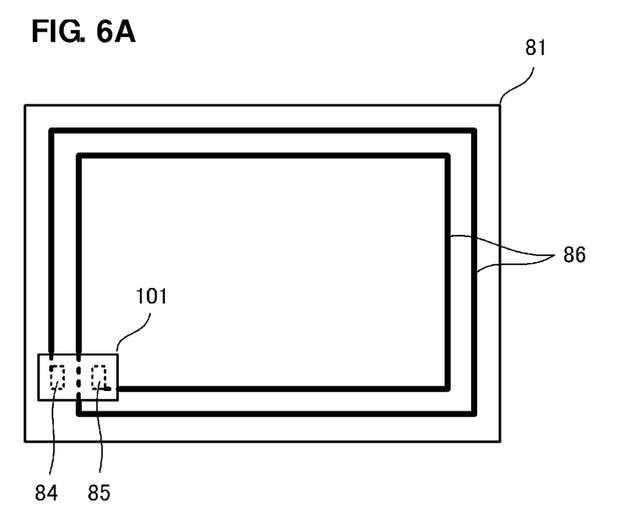
FIGS. 6A and 6B are plan views of two different RFIC devices.
Figure 6B:
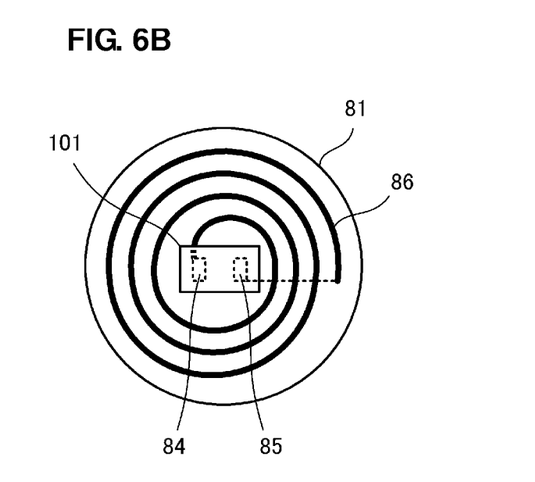

FIGS. 6A and 6B are plan views of two different RFIC devices. In each of the examples illustrated in FIGS. 6A and 6B, a radiation electrode 86 having a spiral shape is disposed on an upper surface of a flexible base 81. RFIC module mounting lands 84 and 85 are provided at both ends of the radiation electrode 86.

An RFIC module 101 is mounted to the RFIC module mounting lands 84 and 85. The RFIC module 101 preferably has the same construction as that in the first preferred embodiment. The illustrated RFIC devices can be each used as an RFID tag for an HF band.

In the example of FIG. 6A, the radiation electrode 86 is preferably located only on one surface of the flexible base 81. In the example of FIG. 6B, the spiral radiation electrode 86 extending from the RFIC module mounting land 84 is provided on a front surface of the flexible base 81, and a crossover line electrode to connect an outer peripheral end of the spiral radiation electrode 86 and the RFIC module mounting land 85 is provided on a rear surface of the flexible base 81. Further, a first end of the crossover line electrode and the RFIC module mounting land 85 are electrically connected to each other by a via conductor, and a second end of the crossover line electrode and the outer peripheral end of the spiral radiation electrode 86 are electrically connected to each other by another via conductor.

Other Preferred Embodiments

While, in the preferred embodiment illustrated in FIGS. 4A to 4C, the two mounting lands 51 and 54 are preferably not parallel to each other on the mounting substrate, two parallel or substantially parallel mounting lands may be provided on the mounting substrate. In such a case, a first RF terminal and a first NC terminal of an RFIC chip are connected to one of the two parallel mounting lands, and a second RF terminal and a second NC terminal of the RFIC chip are connected to the other mounting land.

As an alternative, the direction in which the mounting land is extended and the direction in which the external connection terminal electrode is extended may be arranged perpendicular or substantially perpendicular to each other. Such an arrangement can contribute to further increasing the protection performance of the RFIC chip against warping and bending in two-axis directions perpendicular or substantially perpendicular to each other.

Additionally, in the present invention, the term "NC terminal" implies a terminal electrically independent of an RF circuit (i.e., a processing circuit for an RF signal). Thus, the NC terminal may be a floating terminal (dummy terminal) that is not connected to any other circuits including the RF circuit, or a terminal, e.g., a memory test terminal, which causes no problems from the viewpoint of characteristics even when the NC terminal is connected to the RF terminal.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A radio frequency integrated circuit chip mounting structure comprising:
    a radio frequency integrated circuit chip including an RF circuit and a plurality of external terminals including a radio frequency terminal that is electrically connected to the RF circuit and an electrically independent terminal that is not electrically connected to the RF circuit; and
    a mounting substrate including a flexible base and a plurality of mounting lands which are located on a surface of the flexible base, the plurality of external terminals of the radio frequency integrated circuit chip being electrically connected to the plurality of mounting lands;
    at least one of the plurality of mounting lands being a shared mounting land to which the radio frequency terminal and the electrically independent terminal are electrically connected in common; and
    the shared mounting land being arranged to cover at least one side of the radio frequency integrated circuit chip when viewed from above.

2. The radio frequency integrated circuit chip mounting structure according to claim 1, wherein the shared mounting land is arranged to cover two adjacent sides of the radio frequency integrated circuit chip when viewed from above.

3. The radio frequency integrated circuit chip mounting structure according to claim 1, wherein the mounting substrate includes a plurality of external connection terminal electrodes located on a lower surface of the mounting substrate and which are electrically connected to the mounting lands, and at least one of the plurality of external connection terminal electrodes is arranged to cover at least one side of the radio frequency integrated circuit chip when viewed from above.

4. The radio frequency integrated circuit chip mounting structure according to claim 1, wherein the plurality of external terminals of the radio frequency integrated circuit chip and the mounting lands of the mounting substrate are joined to each other by melted metal particles or solidified electroconductive paste.

* * * * *